(12) United States Patent
Nakatsuji

(10) Patent No.: US 6,873,135 B2
(45) Date of Patent: Mar. 29, 2005

(54) BATTERY PACK AND BATTERY PACK CHECKING METHOD

(75) Inventor: Toshiyuki Nakatsuji, Hyogo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 235 days.

(21) Appl. No.: 10/132,232

(22) Filed: Apr. 25, 2002

(65) Prior Publication Data

US 2002/0195996 A1 Dec. 26, 2002

(30) Foreign Application Priority Data

Apr. 25, 2001 (JP) ........................................ 2001-127436

(51) Int. Cl.⁷ .................................................. H02J 7/00
(52) U.S. Cl. ........................ 320/132; 320/134; 320/136
(58) Field of Search ................................ 320/132, 134, 320/136

(56) References Cited

U.S. PATENT DOCUMENTS

| 5,493,197 A | * | 2/1996 | Eguchi et al. | ............... 320/116 |
| 5,547,775 A | * | 8/1996 | Eguchi et al. | ............... 320/118 |
| 5,578,915 A |   | 11/1996 | Crouch, Jr. et al. | |
| 5,808,446 A | * | 9/1998 | Eguchi | ........................ 320/134 |
| 5,929,593 A | * | 7/1999 | Eguchi | ........................ 320/139 |
| 6,294,894 B1 |   | 9/2001 | Ochiai et al. | |
| 6,313,606 B1 | * | 11/2001 | Eguchi | ........................ 320/132 |

FOREIGN PATENT DOCUMENTS

| JP | 7-055903 | 3/1995 |
| JP | 11-234910 | 8/1999 |
| JP | 2000-60007 | 2/2000 |
| JP | 2000-195559 | 7/2000 |
| JP | 2001-128301 | 5/2001 |

* cited by examiner

*Primary Examiner*—Bao Q Vu
(74) *Attorney, Agent, or Firm*—RatnerPrestia

(57) ABSTRACT

The present invention is a battery pack with BMU mounted in the control circuit for controlling battery voltage, etc. In order to avoid worsening of the battery pack durability due to failure of suspension of charging when full-charge detection or over-charge detection is not executed at all because of trouble in the battery voltage measuring section, the battery pack comprises a self-checking section which integrates the charging capacity during charging and detects whether or not the charging capacity is higher than a set-value and turns OFF the charging FET, thereby executing the trouble checking of charging capacity.

32 Claims, 7 Drawing Sheets

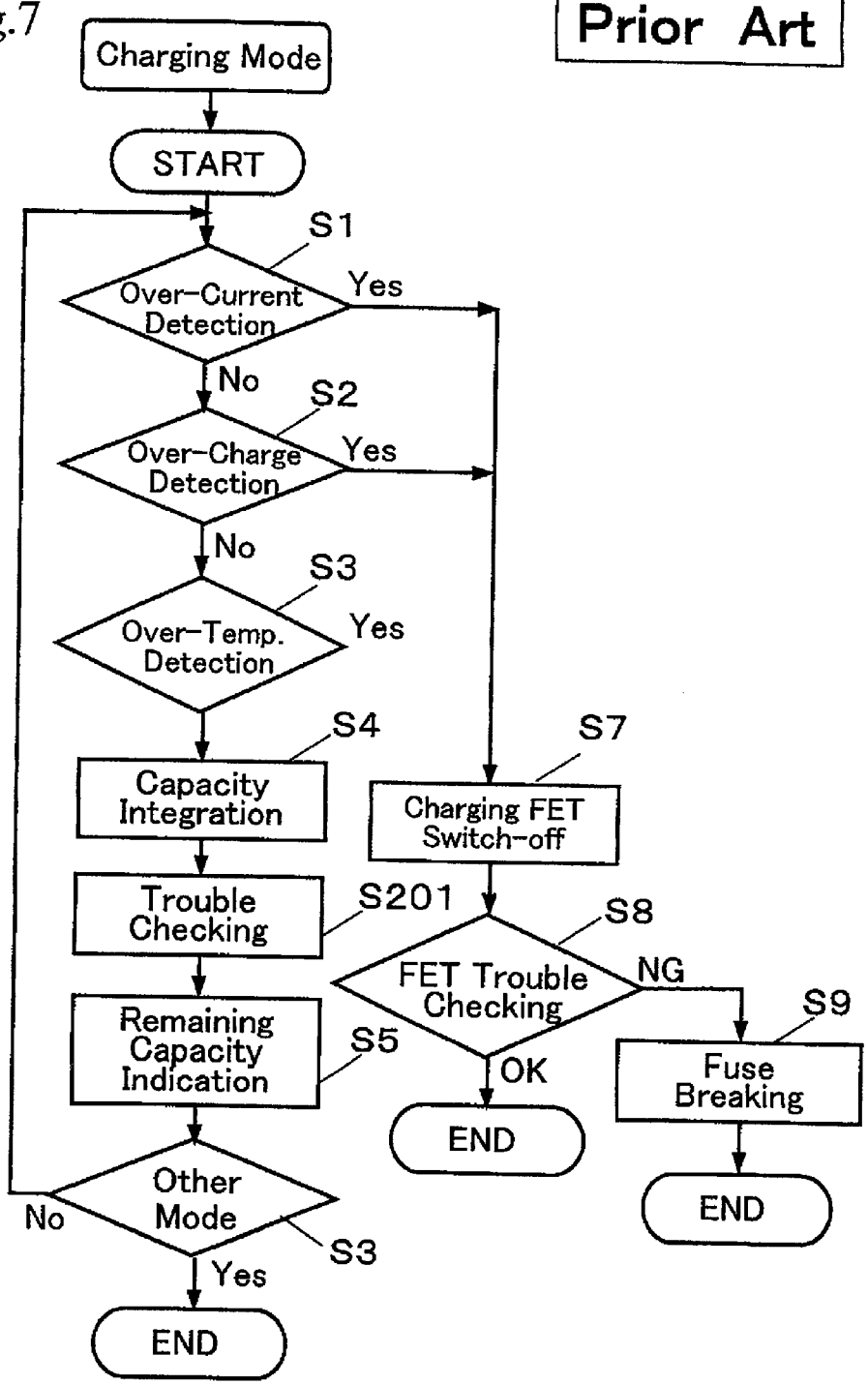

BATTERY PACK AND BATTERY PACK CHECKING METHOD

FIELD OF THE INVENTION

The present invention relates to a battery pack, electronic equipment using the battery pack, and method of checking the same.

BACKGROUND OF THE INVENTION

Recently, the market of rechargeable battery is rapidly expanding. Particularly, non-aqueous rechargeable battery, for example, lithium ion rechargeable battery is widely employed as battery for portable electronic equipment such as a small-sized portable computer and portable telephone unit.

Lithium ion rechargeable battery used as a battery pack in the form of a single battery or a set of batteries is deteriorated in safety and quality due to over-charge and over-discharge. Accordingly, in order to maintain the safety and reliability, a control circuit for preventing over-charge and over-discharge is generally mounted on BMU (Battery Management Unit) in the battery pack for the purpose of management of battery voltage, etc.

In equipment with lithium ion rechargeable battery mounted, full-charge detection is often executed in the battery pack. In this case, CC (Constant Current)/CV (Constant Voltage) control is executed by a charger, and drooping of the current is checked by BMU, and full-charge detection is executed when the current reaches a value less than the value set at a certain temperature. In that case, in order to prevent faulty detection, it is an additional condition that the measured value of total battery voltage is higher than a certain value.

On the other hand, for further improvement of safety, recently proposed is, for example, a function of self-checking by BMU as is disclosed in Japanese Laid-Open Patent No. 1-234910.

FIG. 7 shows a flow chart of charging control including trouble checking.

As shown in FIG. 7, when over-current, over-charge or over-temperature trouble is detected (steps S1, S2, S3), a charging FET (Field Effect Transistor) that is a semiconductor element for closing the charge-and-discharge circuit of BMU added to the battery pack is turned OFF (step S7) to perform the checking of the charging FET (step 8). As a function of detecting the trouble of the charging FET, often employed is a method of cutting off the fuse disposed in the charge-and-discharge circuit after detecting that the charging current keeps flowing even with the charging FET forcibly turned OFF (step S9).

However, in the method described above, there arises a problem such that the charging operation is not suspended but continued even in case the measured value of battery voltage becomes too low, the total battery voltage is not increased, or full-charge or over-charge is not detected at all.

The present invention is intended to solve the problem, and its object is to provide a BMU which is, in addition to conventional over-charge protection, capable of integrating the charge to check for charging capacity trouble, self-checking the trouble of battery pack and discontinuing the charging operation, keeping the battery pack or electronic equipment and systems having the battery pack in safe condition, and storing trouble information to prevent execution of re-charging during generation of trouble.

SUMMARY OF THE INVENTION

In order to achieve the above object, the present invention is a battery pack comprising a charging current measuring section for measuring the charging current during charging of rechargeable battery; a voltage detector for measuring the battery voltage of rechargeable battery; a self-checking section to which is inputted the outputs from the charging current measuring section and the voltage detector; an FET controller that receives the output from the self-checking section; and a charge-and-discharge switch formed of FET controlled by the FET controller, and a trouble checking method for battery pack, wherein the self-checking section integrates only the charging capacity during charging operation and checks whether the charging capacity integrated per charging is higher than the specified level, thereby executing the trouble checking of rechargeable battery or charge control system.

By this configuration, when trouble is found in the battery and battery voltage measuring system checked, it is possible to stop re-charging and to maintain the safety of a battery pack or electronic equipment provided with the battery pack.

Also, the present invention is a battery pack comprising a charging current measuring section for measuring the charging current during charging of rechargeable battery; a voltage detector for measuring the battery voltage of rechargeable battery; a self-checking section to which is inputted the outputs from the charging current measuring section and the voltage detector; an FET controller that receives the output from the self-checking section; and a charge-and-discharge switch controlled by the FET controller, and a trouble checking method for battery pack, wherein the integration of remaining capacity is continued until establishment of full-charge condition irrespective of the charging condition, and the trouble checking of a rechargeable battery or charge control system is executed by checking whether the remaining capacity is higher than the specified level.

By this configuration, the same as in the above description, when trouble is found in the battery and battery voltage measuring system checked, it is possible to stop re-charging and to maintain the safety of the battery pack. An appropriate method may be selected from both of these methods for the relevant battery pack.

Also, in the self-checking section, there is provided an information storing section to store trouble information, which stores trouble information to prevent re-charging from being executed by the pack battery having trouble, and therefore, it is possible to maintain the safety of the battery pack.

Electronic equipment using the battery pack of the present invention includes an input interface for inputting the signal of trouble checking information transmitted from the battery pack and an indicator unit for displaying the trouble checking information. Also, it is preferable to install a charger, which may stop charging in accordance with the trouble checking information.

Battery pack trouble may invite secondary accidents such as breakdown of electronic equipment with the battery pack built in. Accordingly, taking complete safety measure for the battery pack will lead to the enhancement of safety and reliability of the electronic equipment.

BRIEF DESCRIPTION OF THE DRAWINGS

FIG. 7 is a flow chart showing the entire control of a conventional system.

DETAILED DESCRIPTION OF THE INVENTION

The preferred embodiments of the present invention will be described in the following with reference to the drawings.

First Preferred Embodiment

Figure 1:
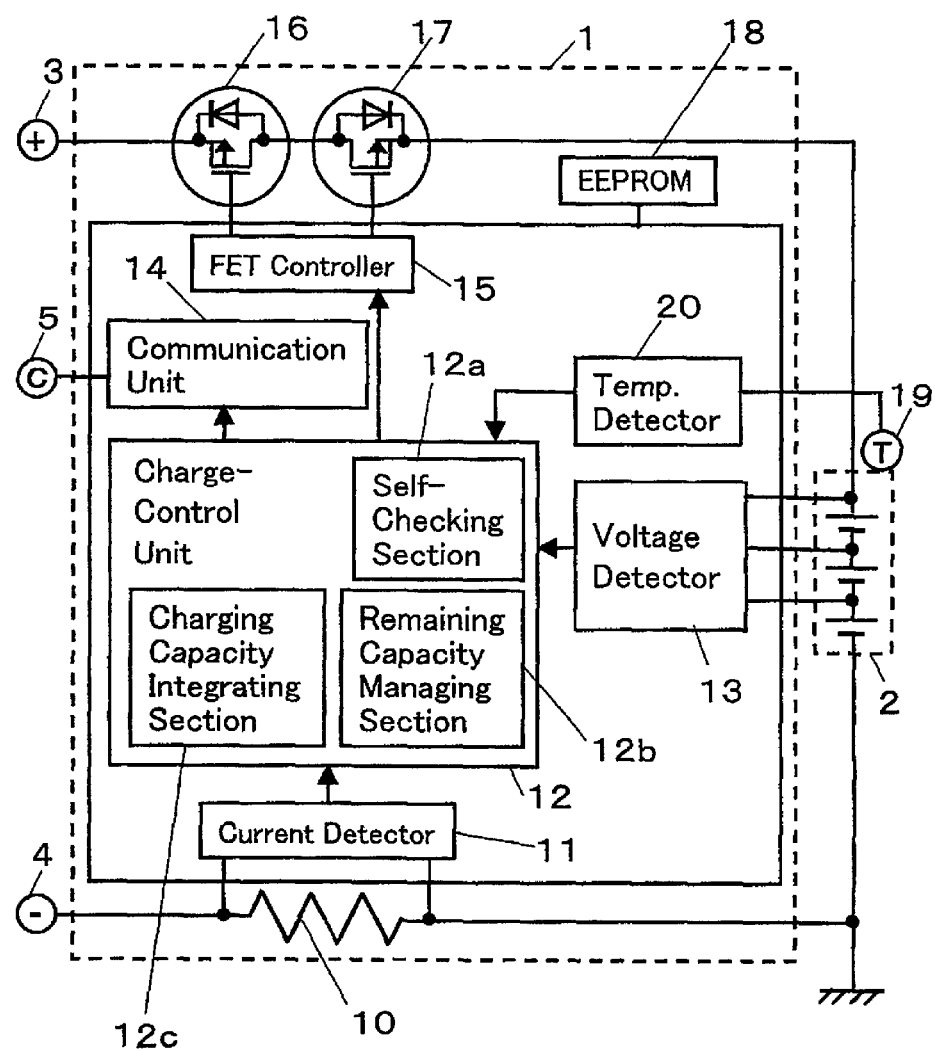
FIG. 1 is a block diagram of a battery pack having a trouble checking function of the present invention.

FIG. 1 is a block diagram of a battery pack, showing an example of configuration in the preferred embodiment of the present invention. The battery pack shown in FIG. 1 comprises BMU (Battery Management Unit) 1 including the battery pack checking function of the present invention and other control function; rechargeable battery 2 in the form of a single battery or a set of batteries; positive electrode terminal 3 and negative electrode terminal 4 which are connected to electronic equipment; and communication terminal 5 for outputting the information such as the result of trouble checking. In the present preferred embodiment, lithium ion rechargeable battery is described as an example of rechargeable battery 2, but the type of battery as rechargeable battery 2 is not limited to this type only. The present invention may be applied even when other types of batteries such as nickel hydrogen battery and lithium polymer rechargeable battery are used.

BMU 1 having the battery trouble checking function of the present invention comprises a current detecting resistor 10, current detector 11, charge control unit 12, voltage detector 13, communication unit 14, FET controller 15, charging FET 16, discharging FET 17, EEPROM (Electrically Erasable and Programmable Read Only Memory) 18, and temperature detector 20 The charge control unit 12 includes a self-checking section 12a, remaining capacity managing section 12b, and charge integrating section 12c. Also, the current detecting resistor 10 and current detector 11 are combined to form a charging current measuring section. As a charge-and-discharge switch, charging FET 16 and charging FET 17 are used. Also, EEPROM 18 is a semiconductor memory element, which is an information storing section disposed in BMU 1. Temperature sensor 19 for measuring the temperature of rechargeable battery 2 is combined with the temperature detector 20, forming a temperature measuring section. All of the outputs from these measuring sections are input to the charge control unit 12 for the purpose of management and control of the charging and discharging operations of rechargeable battery 2.

In this preferred embodiment, the current detecting resistor 10 is disposed at the negative electrode side, and the charging FET 16 and discharging FET 17 are disposed at the positive electrode side, but their functions remain unchanged irrespective of the sides.

The operation of each component element is described in the following. In the present preferred embodiment, the current detecting resistor 10 disposed at the negative electrode side serves to detect charging and discharging current that flows in rechargeable battery 2. The current detector 11 always receives signals from the current detecting resistor 10, and outputs the signal of charging and discharging current flowing in rechargeable battery 2 to the self-checking section 12a according to the command of a control element (not shown) of the charge control unit 12. The output signal is preferable to be emitted from the current detector 11 to the self-checking section 12a at all times or, for example, at intervals of a few seconds.

Also, the voltage detector 13 serves to detect the voltage of rechargeable battery 2, and outputs signals to the self-checking section 12a according to the command of a control element of the charge control unit 12 the same as in current detection. In this case, when the rechargeable battery 2 is a single battery, there is no problem because the voltage signal emitted to the self-checking section 12a is only the signal output of voltage of the single battery, but in case the rechargeable battery 2 is a set of batteries including a plurality of cells, it is preferable to detect the voltage of each individual battery at the voltage detector 13 and to output the voltage signal of each individual battery as it is or to output the voltage signal of some batteries each time or the total voltage signal of all batteries at a time. It is also preferable to detect the total battery voltage of a set of batteries including a plurality of cells and to output the voltage signal. It is preferable to detect the voltage of each battery because, for example, variation may be detected and eliminated, and needless to say, it is also preferable to select an appropriate method in accordance with the condition.

The temperature detector 20 measures and detects the temperature of rechargeable battery 2 itself by means of temperature sensor 19 such as a thermistor which is fitted in contact with the rechargeable battery 2, and outputs the signal to the self-checking section 12a according to the command of a control element of the charge control unit 12 the same as in current detection and voltage detection. In this case, detected is whether the temperature is within the temperature range set in accordance with the charging operation, discharging operation, etc.

The self-checking section 12a in the charge control unit 12 receives the signal input from the current detector 11 and voltage detector 13, and compares it with the reference value stored in the charge control unit 12 in order to check for over-voltage and over-current.

In the present preferred embodiment, an IC-based example is described with respect to BMU 1, but it is not limited only to an IC-based BW 1. In case BMU 1 is not IC-based, it is also preferable to use a configuration such that the result of comparison by a comparator is just outputted to the communication unit 14 and FET controller 15 for the purpose of obtaining the function of the self-checking section 12a.

In the package of the IC-based BMU 1 can be included FET trouble checking function, over-charge control circuit trouble function, and shut-down checking function for limitation and suspension of the charging operation in case of power failure, etc.

By housing IC-based BMU 1 into one package, it is possible to reduce the size of the battery pack itself as well as BMU 1 and to decrease the number of components used and consequently to reduce the man-hour in the assembly manufacturing process.

In the checking result of the self-checking section 12a, when no over-voltage, over-current, FET trouble or charging capacity trouble is detected, then a signal telling that the battery pack is normal will be outputted to the communication unit 14, and a signal for keeping the charging FET 16 and discharging FET 17 turned ON will be outputted to the FET controller 15.

In the checking result of the self-checking section 12a, when over-voltage is detected, then a signal telling that the battery pack is in over-voltage trouble will be outputted to the communication unit 14, and a signal for turning OFF the charging FET 16 when in, charging mode will be outputted to the FET controller 15.

Also, in the checking result of the self-checking section 12a, when over-current is detected, then a signal telling that the battery pack is in over-current trouble will be outputted to the communication unit 14, and a signal for turning OFF the charging FET 16 and discharging FET 17 will be outputted to the FET controller 15.

And, in the checking result of the self-checking section 12a, when secondary battery 2 being outside the set temperature range is detected, a signal telling that the temperature of secondary battery 2 is outside the range of temperature set according to the charging and discharging operations will be outputted to the communication unit 14, and also outputted is a signal for turning OFF the FET in accordance with respective operations.

When FET trouble is detected, the signal will be outputted to the communication unit 14, and also the FET is turned OFF.

As described above, a conventional battery pack is provided with BMU that can detect the voltage and current and integrate the charging capacity. On the other hand, in the case of the battery pack in the preferred embodiment of the present invention, the BMU is provided with a self-checking function of checking, for example, the charging capacity or the integrated value of remaining capacity before full charge, as described later, during charging the rechargeable battery, in addition to trouble checking based on the voltage value, current value, and integrated value of charging capacity. Accordingly, it is possible to provide a battery pack having excellent reliability and high quality, and a trouble checking method.

The battery pack described above is an excellent battery pack capable of solving the conventional problem. However, it has been revealed that there is another problem that cannot be solved even with the function added to BMU in order to solve the conventional problem. The problem is related to the method of checking charging capacity through trouble checking, that is, full-charge detection is not executed in case the battery and voltage measuring system are in trouble, and charging is not discontinued because of normal FET, and then the charging operation may continue even when the charging capacity is abnormally high.

How to solve this new problem related to the method of trouble checking will be described in the following.

Figure 2:
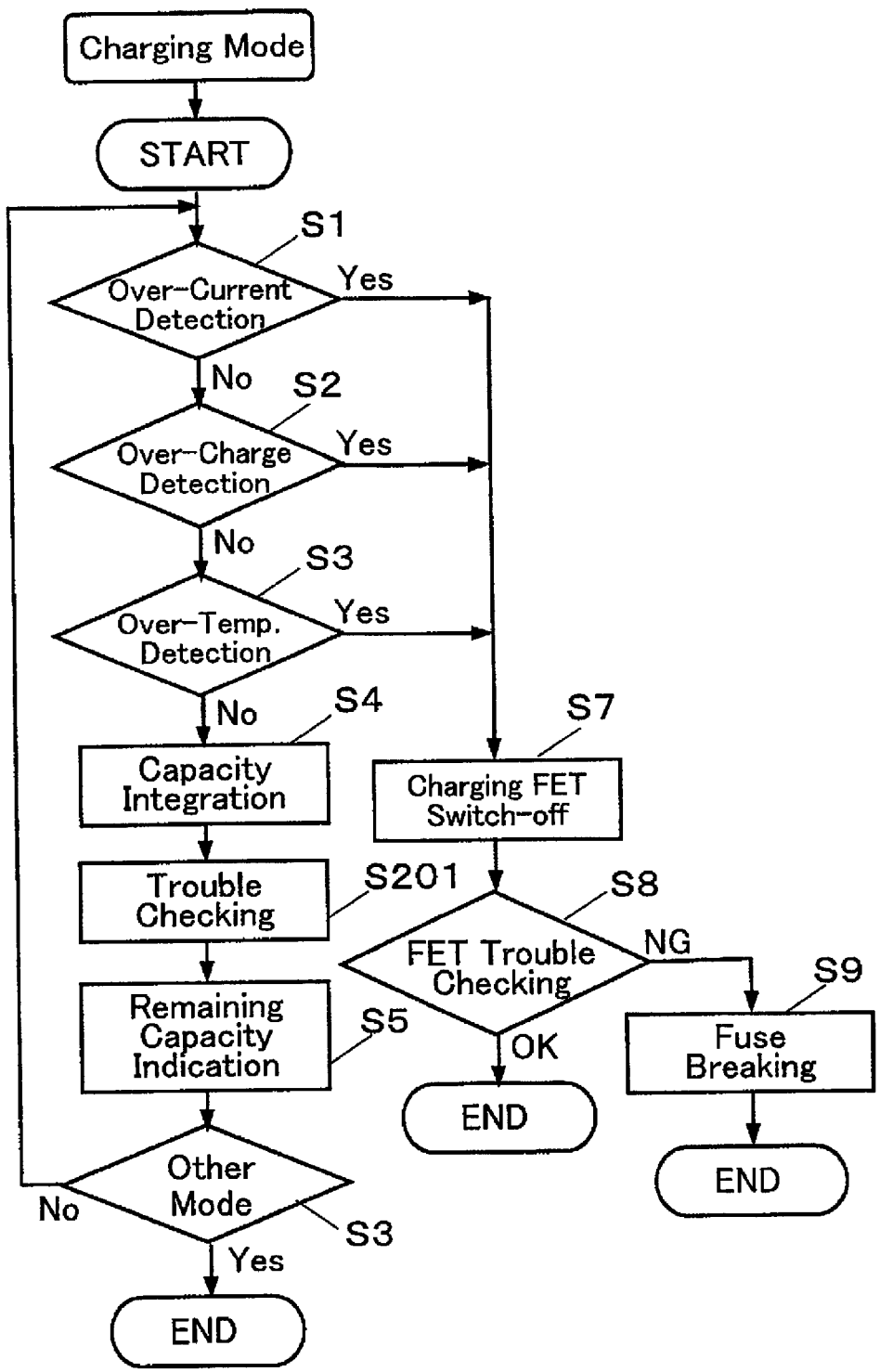
FIG. 2 is a flow chart showing the entire control of the present invention.

In order to prevent the charging operation from being continued after abnormal increase of the charging capacity, trouble checking is to be executed with respect to charging capacity trouble. FIG. 2 is a flow chart showing the whole process of trouble checking method. In FIG. 2, the difference from FIG. 7 showing a conventional process of trouble checking is that there is provided a trouble checking process (step S201) to check for charging capacity trouble between the process (step S4) of charge integration (capacity integration in FIG. 2) and the process (step 5) of remaining capacity indication.

The trouble checking of charging capacity is described in the following with reference to FIG. 3 to FIG. 6.

Figure 3:
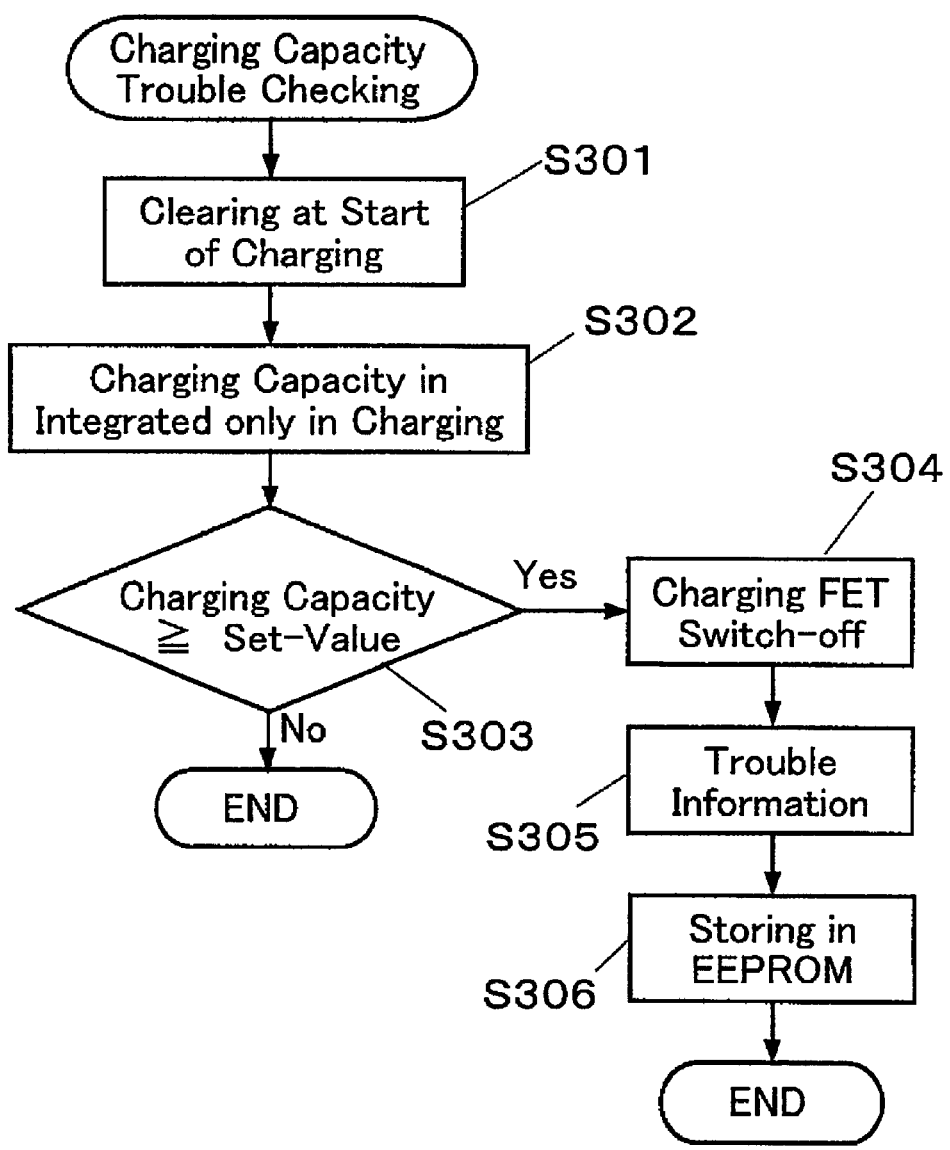
FIG. 3 is a flow chart showing the trouble checking of charging capacity in the present invention.

FIG. 3 is a flow chart showing in detail the charging capacity trouble checking (step S201) in case of integrating the charging current by charging capacity integrating section 12c during charging of rechargeable battery 2 for one-time charging in the process of trouble checking in FIG. 2. The checking process is executed by clearing the integrated charge when the operation mode is shifted from charging mode to other mode (discharging, leaving in case of full charge) or at start of charging when the mode is shifted from other mode to charging mode (step S301). As for the state of charging capacity, only the charging capacity is integrated and controlled by the charging capacity integrating section 12c in the charge control unit 12 (step S302).

Figure 4:
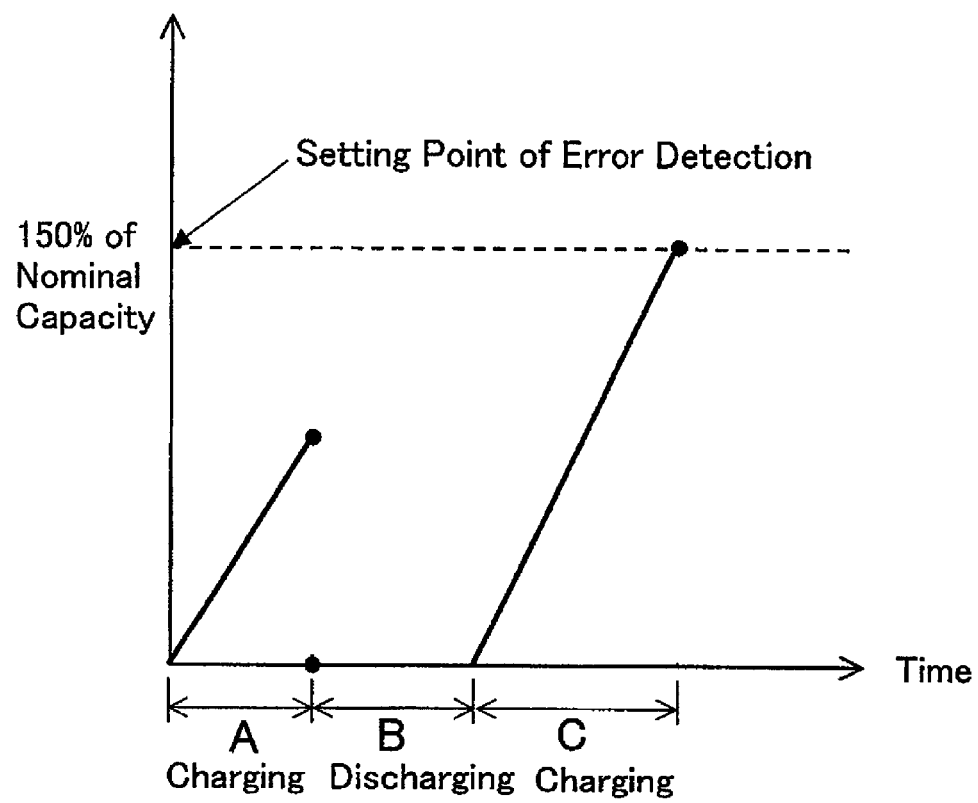
FIG. 4 is a chart of correlation between charging status and integrated charge in the present invention.

FIG. 4 is a diagram of correlation between charging status and integrated charge in actual charging and discharging of rechargeable battery 2, that is, a graph showing the time variation of integrated charge. As shown in FIG. 4, the integrated charge increases during charging corresponding to the period A, but it is cleared to integrated charge 0 during discharging corresponding to the period B in other mode. And, the mode enters into the charging period C, and if the charge by one-time charging exceeds the upper limit of integrated capacity set for assuring safety, it is detected as a charging capacity error (step S303 in FIG. 3), then each process shown at the right-hand side of FIG. 3 is executed. In FIG. 4, described is an example of setting the upper limit value of integrated charge to 150% of the nominal capacity for assuring safety, but it is not limited only to 150%. The upper limit value varies depending upon the type of rechargeable battery and the operating condition, and it may be sometimes set to 120% of the nominal capacity, and sometimes setting it to a value higher than 200% causes no problems. Accordingly, the upper limit of integrated charge is basically set to a value higher than the nominal capacity.

In case the charging capacity value integrated during charging of rechargeable battery 2 exceeds the upper limit of capacity value previously specified, the self-checking section 12a emits the output signal to finish the checking operation (step S303), and subsequently the charging FET 16 is forcibly turned OFF (step S304). Then, the equipment side is informed of the trouble through the communication unit 14 (step S305), and also, the trouble information is stored into a memory such as EEPROM 18 that is an information storing section disposed in BMU 1 (step S306).

As described above, trouble checking has been conventionally executed only with a battery pack having BMU capable of detecting the voltage and current and integrating the charging capacity and with the voltage value, current value, and the integrated value of charging capacity. In the case of a battery pack and its trouble checking method in the exemplary embodiment 1 in the preferred embodiments of the present invention, only the charging capacity is integrated during charging the rechargeable battery, and BMU is provided with a self-checking function of checking whether the charging capacity integrated per charging is higher than the specified value, and therefore, it is possible to provide a battery pack having excellent reliability and high quality, and its trouble checking method.

Preferred Embodiment 2

A battery pack and its trouble checking method in the second preferred embodiment of the present invention will be described in the following. The battery pack of the second preferred embodiment is same in configuration as in the block diagram shown in FIG. 1. Same reference numerals are used for the corresponding component elements, and the detailed description is omitted with respect to the configuration of battery pack and the function of each component element in order to avoid repetition of same description.

The battery pack operation procedure and the trouble checking method in the second preferred embodiment of the present invention will be described with reference to FIG. 5 and FIG. 6.

Figure 5:
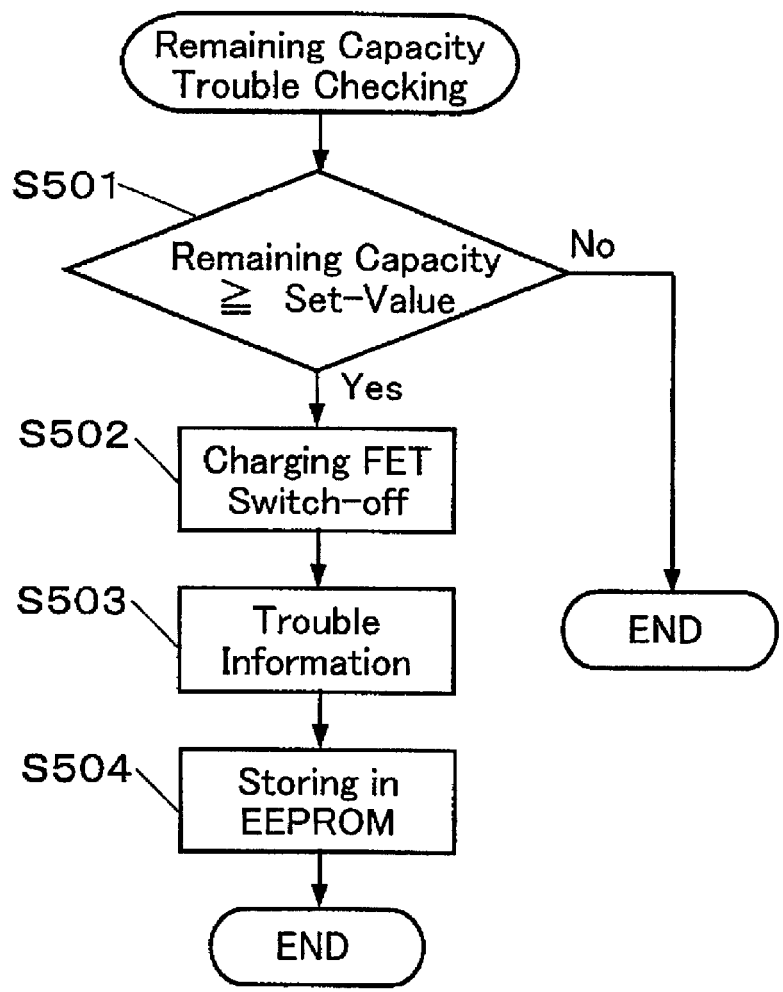
FIG. 5 is a flow chart of trouble checking of remaining capacity in the present invention.

FIG. 5 is a flow chart showing in detail the charging capacity trouble checking during charging of rechargeable battery 2 in the trouble checking process of FIG. 2 from a different viewpoint from that in the first preferred embodiment. In the second preferred embodiment, integrated at BMU 1 of the battery pack is not the only one-time charge, but the remaining capacity is managed by remaining capacity managing section 12b in charge control unit 12 disposed in the BMU 1 shown in FIG. 1 so that proper measure is taken in case the remaining capacity becomes abnormal exceeding the leaning capacity through repetition of charging and discharging.

Until detection of full charge during charging operation, adding the capacity of charging current to the value of remaining capacity is continued even when the remaining capacity exceeds 100% of the learning capacity, and in case the value of remaining capacity integrated exceeds the previously specified value, then it is detected as charging capacity trouble. Also in this case, as described later, if the capacity is detected as being abnormal, the self-checking section 12a in the charge control unit 12 forcibly turns OFF the charging FET 16.

Figure 6:
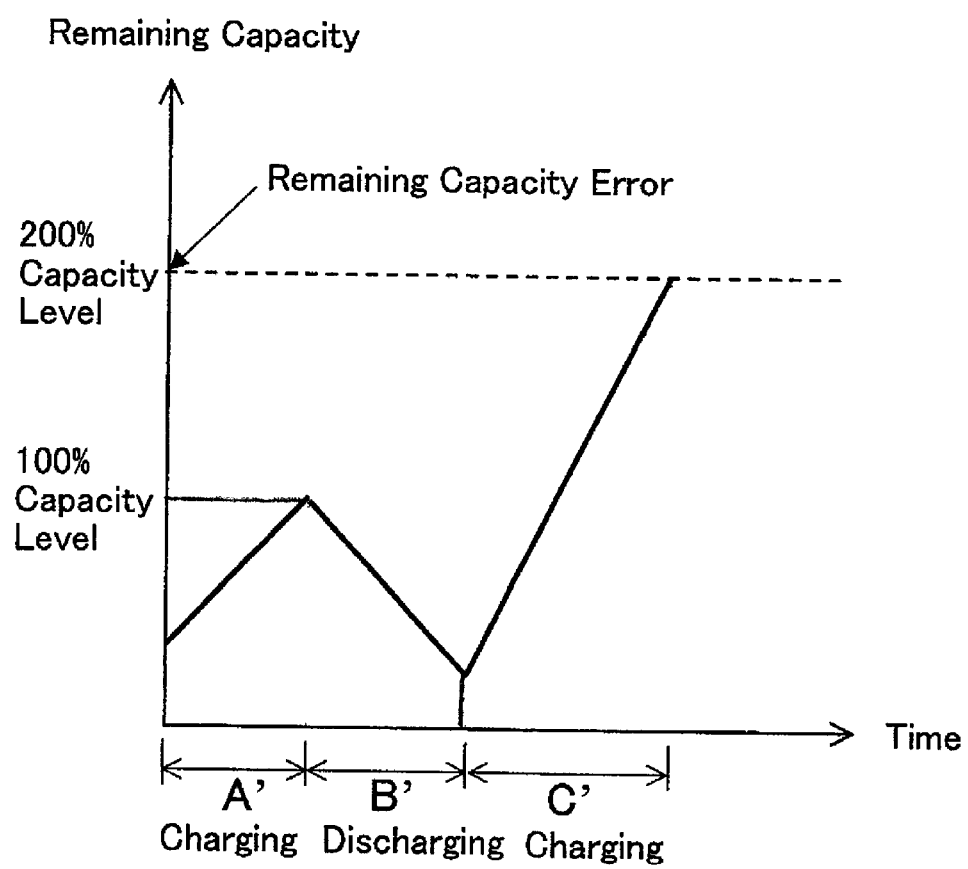
FIG. 6 is a chart of correlation between charging status and remaining capacity in the present invention.

FIG. 6 is a diagram of correlation between charging status and remaining capacity in actual charging and discharging of rechargeable battery 2 in the second preferred embodiment of the present invention, showing the time variation of remaining capacity, which is different from the relationship between charging status and integrated charge in charging and discharging shown in FIG. 4. As shown in FIG. 6, the integrated charge is increased in the charging period A', and the value of remaining capacity is not reset to 0 and cleared but the discharging capacity is decreased in the charging period B'. And, when the state of charge becomes as follows, the integrated charge is further increased from the level of decreased charge. As the operation is repeated, it comes to the charging period C', and when the value exceeds the upper limit of remaining capacity set during the period for assuring safety, it is detected as a remaining capacity error (step S501 in FIG. 5) and each process described below is executed. Here, in FIG. 6, an example of setting the upper limit of integrated capacity to 200% of the learning capacity is described, but it is not limited only to 200%. The upper limit value varies depending upon the type of rechargeable battery and the operating condition and is sometimes set to about 150% of the learning capacity depending on the condition. Accordingly, the upper limit of integrated capacity is basically set to a value higher than the nominal capacity.

In each of the first and second preferred embodiments, it is preferable to set the upper limit to a value several times higher than the nominal capacity or the learning capacity as usually improbable capacity value.

Particularly, it is preferable to set up a configuration so that the specified value is several times higher than the learning capacity value that changes every charge and discharge, taking into account cycle deterioration or the like in the second preferred embodiment.

When it is detected as remaining capacity trouble (step S501 in FIG. 5), the self-checking section 12a outputs either or both of a signal for informing the battery pack trouble and a signal for discontinuing the charging operation to electronic equipment through communication unit 14.

Specifically, the charging FET 16 is forcibly turned OFF (step S502), and battery pack trouble is informed to the equipment side through communication unit 14 (step S503), and also the trouble information is stored in a memory such as EEPROM 18 that is an information storing section disposed in BMU 1 (step S504).

EEPROM 18 is a memory as an information storing section disposed in BMU 1 and serves to store a trouble history for suspension of charging. Thus, since there remains a trouble history in case of a battery pack having trouble, the self-checking section 12a reads the information from EEPROM 18 before charging is started with the battery pack connected to electronic equipment, and thereby, the battery pack having a trouble history will not be charged. As a result, it is possible to avoid charging of a battery pack having trouble.

It is also possible to include such functions as FET trouble checking function, overcharge control circuit (not shown) and checking function for the overcharge control circuit in the self-checking section 12a separately IC-based and housed in one package.

Also, electronic equipment having a battery pack of the present invention comprises an input interface for inputting the signal showing the trouble information delivered from the battery pack. And, it is preferable to include an indicator unit for indicating the trouble information. Further, electronic equipment having a battery pack of the present invention is preferable to incorporate a charger that is able to suspend charging in accordance with the trouble checking information.

As is apparent from the above preferred embodiment, according to the present invention, it is possible to prevent failure of charging suspension in case of battery trouble, voltage detecting circuit trouble or full-charge detection trouble, and to fulfill the role as a double protection means and also to quickly detect trouble, thereby preventing occurrence of overcharge trouble.

Also, it is possible to provide a highly reliable battery pack that can be miniaturized without using newly additional parts, unlike a conventional one, electronic equipment using the battery pack, and their trouble checking method.

What is claimed is:

1. A battery pack comprising: a rechargeable battery; a management/control unit for managing/controlling the charge and discharge of said rechargeable battery, wherein said management/control unit comprises: a current detecting resistor; a charging current measuring section for measuring the charging current of said rechargeable battery that flows in the current detecting resistor; a voltage detector for measuring the voltage of said rechargeable battery; a temperature detector for measuring and detecting temperatures by means of a temperature sensor fitted to said rechargeable battery; a charge control unit for receiving the outputs from said charging current measuring section, said voltage detector, and said temperature detector; and a charge-and-discharge switch responsive to the charge control unit, and said charge control unit including
a self-checking section for monitoring the charging and discharging operation of said rechargeable battery responsive to the output signals from at least one of said charging current measuring section and said voltage detector, and
a charging capacity integrating section, and in self-checking performed by the self-checking section of said charge control unit, only charging capacity during charging is integrated, and trouble checking is executed at the rechargeable battery or management/control unit by checking whether or not the charming capacity integrated per charging is higher than a specified valued.

2. The battery pack of claim 1, wherein the maximum value of charging capacity integrated per charging is set higher than the nominal capacity of rechargeable battery.

3. A battery pack comprising: a rechargeable battery; a management/control unit for managing/controlling the charge and discharge of said rechargeable battery, wherein said management/control unit comprises: a current detecting resistor; a charging current measuring section for measuring the charging current of said rechargeable battery that flows in the current detecting resistor; a voltage detector for measuring the voltage of said rechargeable battery; a temperature detector for measuring and detecting temperatures by means of a temperature sensor fitted to said rechargeable battery; a charge control unit for receiving the outputs from said charging current measuring section, said voltage detector, and said temperature detector; and a charge-and-discharge switch responsive to the charge control unit, and said charge control unit including
   a self-checking section for monitoring the charging and discharging operation of said rechargeable battery responsive to the output signals from at least one of said charging current measuring section and said voltage detector and
   wherein the charge control unit includes a remaining capacity managing section capable of integrating remaining capacity until establishment of a full-charge condition, said battery pack performing trouble checking by determining whether said integrated remaining capacity goes above a specified value during charging.

4. The battery pack of claim 3, wherein the maximum value of remaining capacity value integrated by the remaining capacity managing section is set higher than the learning capacity of rechargeable battery.

5. The battery pack of claim 1, wherein there is provided a communication unit which receives the output of the self-checking section and delivers the information to externally connected electronic equipment.

6. The battery pack of claim 1, wherein the self-checking section comprises an information storing section that stores trouble information.

7. Electronic equipment, comprising: the battery pack of claim 1 comprising a communication unit which receives the output of the self-checking section and delivers the information to externally connected electronic equipment, and an information storing section for storing trouble information in said self-checking section;
   an input interface for inputting a signal showing the information obtained through trouble checking with respect to the battery pack; and
   an indicator unit for indicating information obtained through the trouble checking.

8. Electronic equipment, comprising: the battery pack of claim 1 comprising a communication unit which receives the output of the self-checking section and delivers the information to externally connected electronic equipment, and an information storing section for storing trouble information in said self-checking section,
   wherein there is provided a charger which stops charging in accordance with trouble checking result information transmitted from said battery pack.

9. A trouble checking method for battery pack, that is a method of management/control of charging and discharging operation executed by a management/control unit disposed in the battery pack in charging and discharging of the battery pack of claim 1 according to the steps of: checking for over-current, over-charge, and whether or not the temperature of rechargeable battery is within the range of setting; turning OFF a charging FET (Field Effect Transistor) that is a semiconductor for switching a charge-and-discharge circuit; detecting that charging current keeps flowing even with said charging FET forcibly turned OFF and executing trouble checking of said charging FET; breaking a fuse disposed in the charge-and-discharge line; integrating the charging capacity of the battery pack; indicating the remaining amount of battery capacity; and checking for charging capacity trouble,
   wherein trouble checking of the battery pack is executed by a step of checking for charging capacity trouble, and
   the step of checking for charging capacity trouble is performed between the step of integrating the charging capacity of battery pack and the step of indicating the remaining amount of battery capacity.

10. The trouble checking method for battery pack of claim 9, that is a method of checking for charging capacity trouble in charging and discharging of the battery pack, including the steps of:
   clearing the integrated charging capacity when the operation mode is shifted;
   controlling the charging capacity by a charging capacity integrating section in the charge control unit, controlling only the integration of charging capacity;
   detecting charging capacity trouble by emitting a signal from the self-checking section when the value of charging capacity integrated during rechargeable battery charging exceeds a previously specified set-value;
   forcibly turning OFF the charging FET;
   informing the trouble to the equipment side through a communication unit; and
   storing the trouble information in an information storing section.

11. The trouble checking method for battery pack of claim 10, wherein the maximum value of charging capacity integrated per charging is set to a value higher than the nominal capacity of rechargeable battery.

12. The trouble checking method for battery pack of claim 9, wherein remaining capacity trouble checking in charging and discharging of the battery pack includes the steps of:
   detecting remaining capacity trouble by emitting a signal from the self-checking section when the remaining capacity during rechargeable battery charging exceeds a previously specified set-value;
   forcibly turning OFF the charging FET;
   informing the trouble to the equipment side through the communication unit; and
   storing the trouble information in the information storing section.

13. The trouble checking method for battery pack of claim 12, wherein the maximum value of remaining capacity integrated by a remaining capacity managing section is set higher than the learning capacity of rechargeable battery.

14. The battery pack of claim 1, wherein there is provided a communication unit which receives the output of the self-checking section and delivers the information to externally connected electronic equipment.

15. The battery pack of claim 2, wherein there is provided a communication unit which receives the output of the self-checking section and delivers the information to externally connected electronic equipment.

16. The battery pack of claim 3, wherein there is provided a communication unit which receives the output of the self-checking section and delivers the information to externally connected electronic equipment.

17. The battery pack of claim 4, wherein there is provided a communication unit which receives the output of the self-checking section and delivers the information to externally connected electronic equipment.

18. The battery pack of claim 1, wherein the self-checking section comprises an information storing section that stores trouble information.

19. The battery pack of claim 2, wherein the self-checking section comprises an information storing section that stores trouble information.

20. The battery pack of claim 3, wherein the self-checking section comprises an information storing section that stores trouble information.

21. The battery pack of claim 4, wherein the self-checking section comprises an information storing section that stores trouble information.

22. Electronic equipment, comprising: the battery pack of claim 1 comprising a communication unit which receives the output of the self-checking section and delivers the information to externally connected electronic equipment, and an information storing section for storing trouble information in said self-checking section;
an input interface for inputting a signal showing the information obtained through trouble checking with respect to the battery pack; and
an indicator unit for indicating information obtained through the trouble checking.

23. Electronic equipment, comprising: the battery pack of claim 2 comprising a communication unit which receives the output of the self-checking section and delivers the information to externally connected electronic equipment, and an information storing section for storing trouble information in said self-checking section;
an input interface for inputting a signal showing the information obtained through trouble checking with respect to the battery pack; and
an indicator unit for indicating information obtained through the trouble checking.

24. Electronic equipment, comprising: the battery pack of claim 3 comprising a communication unit which receives the output of the self-checking section and delivers the information to externally connected electronic equipment, and an information storing section for storing trouble information in said self-checking section;
an input interface for inputting a signal showing the information obtained through trouble checking with respect to the battery pack; and
an indicator unit for indicating information obtained through the trouble checking.

25. Electronic equipment, comprising: the battery pack of claim 4 comprising a communication unit which receives the output of the self-checking section and delivers the information to externally connected electronic equipment, and an information storing section for storing trouble information in said self-checking section;
an input interface for inputting a signal showing the information obtained through trouble checking with respect to the battery pack; and
an indicator unit for indicating information obtained through the trouble checking.

26. Electronic equipment, comprising: the battery pack of claim 1 comprising a communication unit which receives the output of the self-checking section and delivers the information to externally connected electronic equipment, and an information storing section for storing trouble information in said self-checking section,
wherein there is provided a charger which stops charging in accordance with trouble checking result information transmitted from said battery pack.

27. Electronic equipment, comprising: the battery pack of claim 2 comprising a communication unit which receives the output of the self-checking section and delivers the information to externally connected electronic equipment, and an information storing section for storing trouble information in said self-checking section,
wherein there is provided a charger which stops charging in accordance with trouble checking result information transmitted from said battery pack.

28. Electronic equipment, comprising: the battery pack of claim 3 comprising a communication unit which receives the output of the self-checking section and delivers the information to externally connected electronic equipment, and an information storing section for storing trouble information in said self-checking section,
wherein there is provided a charger which stops charging in accordance with trouble checking result information transmitted from said battery pack.

29. Electronic equipment, comprising: the battery pack of claim 4 comprising a communication unit which receives the output of the self-checking section and delivers the information to externally connected electronic equipment, and an information storing section for storing trouble information in said self-checking section,
wherein there is provided a charger which stops charging in accordance with trouble checking result information transmitted from said battery pack.

30. The trouble checking method for battery pack, that is a method of checking for charging capacity trouble in charging and discharging of the battery pack of claim 1, including the steps of:
clearing the integrated charging capacity when the operation mode is shifted;
controlling the charging capacity by a charging capacity integrating section in the charge control unit, controlling only the integration of charging capacity;
detecting charging capacity trouble by emitting a signal from the self-checking section when the value of charging capacity integrated during secondary battery charging exceeds a previously specified set-value;
forcibly turning OFF the charging FET;
informing the trouble to the equipment side through a communication unit; and
storing the trouble information in an information storing section.

31. The trouble checking method for battery pack, wherein remaining capacity trouble checking in charging and discharging of the battery pack of claim 1 includes the steps of:
detecting remaining capacity trouble by emitting a signal from the self-checking section when the remaining capacity during secondary battery charging exceeds a previously specified set-value;
forcibly turning OFF the charging FET;
informing the trouble to the equipment side through the communication unit; and storing the trouble information in the information storing section in BMU 1.

32. A battery pack comprising: a rechargeable battery; a management unit for managing and controlling the charge and discharge of the rechargeable battery, said management unit comprising:

a switch for controlling the charge and discharge of the rechargeable battery;

a self-checking section;

a current detector for detecting current flowing in the battery and providing a first output signal to the self-checking section relating to the current;

a voltage detector for measuring the voltage of the battery and providing a second signal to the self-checking section related to the voltage;

a charging capacity integration section for integrating charging capacity and for providing a third output signal responsive to an upper limit of integrated capacity;

wherein the self-checking section turns-off the switch, upon termination of current detection and voltage detection, in response to the third signal.

* * * * *

UNITED STATES PATENT AND TRADEMARK OFFICE
CERTIFICATE OF CORRECTION

PATENT NO. : 6,873,135 B2
DATED : March 29, 2005
INVENTOR(S) : Toshiyuki Nakatsuji It is certified that error appears in the above-identified patent and that said Letters Patent is hereby corrected as shown below:

Column 9,
Line 4, delete "charming" and insert -- charging --.
Line 33, after "section" insert -- , --.

Signed and Sealed this

Twentieth Day of December, 2005

JON W. DUDAS
*Director of the United States Patent and Trademark Office*